United States Patent
Usami

(10) Patent No.: US 9,601,447 B2
(45) Date of Patent: Mar. 21, 2017

(54) SEMICONDUCTOR DEVICE INCLUDING PLURAL SEMICONDUCTOR CHIPS STACKED ON SUBSTRATE

(71) Applicant: Micron Technology, Inc., Boise, ID (US)

(72) Inventor: Sensho Usami, Akita (JP)

(73) Assignee: Micron Technology, Inc., Boise, ID (US)

(*) Notice: Subject to any disclaimer, the term of this patent is extended or adjusted under 35 U.S.C. 154(b) by 14 days.

(21) Appl. No.: 14/713,229

(22) Filed: May 15, 2015

(65) Prior Publication Data

US 2015/0340311 A1    Nov. 26, 2015

(30) Foreign Application Priority Data

May 26, 2014  (JP) .................. 2014-107773

(51) Int. Cl.
*H01L 23/498* (2006.01)
*H01L 25/065* (2006.01)
*H01L 23/00* (2006.01)

(52) U.S. Cl.
CPC ............ *H01L 24/06* (2013.01); *H01L 23/498* (2013.01); *H01L 23/49838* (2013.01); *H01L 24/97* (2013.01); *H01L 25/065* (2013.01); *H01L 25/0657* (2013.01); *H01L 2224/05554* (2013.01); *H01L 2224/32145* (2013.01); *H01L 2224/32225* (2013.01); *H01L 2224/48091* (2013.01); *H01L 2224/48227* (2013.01); *H01L 2224/49171* (2013.01); *H01L 2224/73265* (2013.01); *H01L 2224/97* (2013.01); *H01L 2225/0651* (2013.01); *H01L 2225/06506* (2013.01); *H01L 2225/06524* (2013.01); *H01L 2225/06586* (2013.01); *H01L 2924/15311* (2013.01); *H01L 2924/181* (2013.01)

(58) Field of Classification Search
CPC ..... H01L 23/49838; H01L 2224/48227; H01L 2225/06506; H01L 2225/0651
See application file for complete search history.

(56) References Cited

U.S. PATENT DOCUMENTS

| | | | |
|---|---|---|---|
| 2008/0197509 | A1 | 8/2008 | Yamaguchi et al. |
| 2010/0155957 | A1* | 6/2010 | Han ................. H01L 24/06 257/773 |
| 2013/0137217 | A1* | 5/2013 | Kindo .............. H01L 21/50 438/109 |

FOREIGN PATENT DOCUMENTS

| | | |
|---|---|---|
| JP | 2008198909 A | 8/2008 |
| JP | 2012054496 A | 3/2012 |

* cited by examiner

*Primary Examiner* — Duy T Nguyen
*Assistant Examiner* — Mounir Amer
(74) *Attorney, Agent, or Firm* — Perkins Coie LLP

(57) ABSTRACT

A semiconductor chip at least includes a row of first electrode pad group, which includes at least one first independent electrode pad and multiple first common electrode pads. The interval between the first independent electrode pad and an electrode pad adjacent thereto is defined as "first pitch", and the interval between adjacent electrode pads making up the multiple first common electrode pads is defined as "second pitch". The first pitch is determined to be larger than the second pitch.

21 Claims, 10 Drawing Sheets

SEMICONDUCTOR DEVICE INCLUDING PLURAL SEMICONDUCTOR CHIPS STACKED ON SUBSTRATE

CROSS-REFERENCE TO RELATED APPLICATION

This application is based upon and claims the benefit of priority from Japanese Patent Application No. 2014-107773, filed on May 26, 2014, the disclosure of which is incorporated herein in its entirety by reference.

BACKGROUND OF THE INVENTION

1. Field of the Invention

The present invention relates to a semiconductor device, and more particularly to such a device having a plurality of semiconductor chips which are stacked over a wiring substrate. The present invention may also relate to a method of manufacturing such a device.

2. Background

Japanese Laid-Open Patent Publication No. 2008-198909 discloses an MCP (Multi-chip package) in which multiple memory chips are stacked on a wiring substrate to offer a large memory capacity and, particularly, discloses a configuration in which an upper memory chip is stacked over a lower memory chip via a resin layer such that wires from the lower memory chip are embedded in the resin layer. Common electrode pads of the upper memory chip and the same of the lower memory chip are connected in common to common connection pads of the wiring substrate via wires.

In addition to the common electrode pads, such a memory chip also includes an independent electrode pad, such as CS (Chip Select) electrode pad, that is electrically connected not to the common connection pad but to an independent connection pad of the wiring substrate by one-to-one coupling.

Japanese Laid-Open Patent Publication No. 2012-054496 discloses an MCP configuration in which multiple semiconductor chips having common electrode pads that can be connected in common to common connection pads and independent electrode pads that cannot be connected in common to the common connection pads are stacked such that each of upper and lower semiconductor chips has a relay pad between the independent electrode pad and the common electrode pads and that the independent electrode pad of the upper semiconductor chip is electrically connected to a connection pad of a wiring substrate via the relay pad of the lower semiconductor chip.

An analysis made by the inventor of the present invention has led to the following conclusion.

The independent electrode pad carried by the upper semiconductor chip and the independent electrode pad carried by the lower semiconductor chip must be electrically connected respectively to independent connection pads different from each other on the wiring substrate. When wire bonding is performed, this process is referred to as "selective wire connection".

A number of common electrode pads carried by the upper semiconductor chip and a number of common electrode pads carried by the lower semiconductor chip are electrically connected to the same common connection pads on the wiring substrate such that each pair of common electrode pads carried by the upper and lower semiconductor chips are connected to each common connection pad.

In general, in a row of electrode pad group, an independent electrode pad is located closer to the center of the chip as a number of common electrode pads are arranged on both sides of the independent electrode pad (i.e., located closer to the chip edge). The electrode pad group of the semiconductor chip is formed by a process with high precision, but the connection pad group of the wiring substrate is formed by a process with low precision. As a result, the intervals between the connection pads of the wiring substrate turn out to be wider than the intervals between the electrode pads of the semiconductor chip. In addition, to perform selective wire connection, two independent connection pads need to be provided. For these reasons, a row of connection pad group becomes larger in length than a row of electrode pad group.

As a result, an electrode pad located on an end of the electrode pad group is electrically connected to a connection pad more distant from the electrode pad via a wire, which results in an increase in a wire stretching angle. An increase in the wire stretching angle leads to an increase in the length of a wire made of such an expensive material as gold.

The larger wire stretching angle is apt to cause the wire to interfere with the edge of the semiconductor chip, thus affecting the reliability of the semiconductor device. For example, on the wiring substrate, if the connection pads are located distant from the edge of the semiconductor chip, an increase in the wire stretching angle is suppressed. This, however, invites an increase in the wire length and in the substrate size as well, thus leading to an increase in the size of the semiconductor device. A greater unit substrate size results in fewer unit substrates extracted from one wiring substrate, thus leading to higher manufacturing costs.

DETAILED DESCRIPTION OF THE EMBODIMENTS

This invention will be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1A:
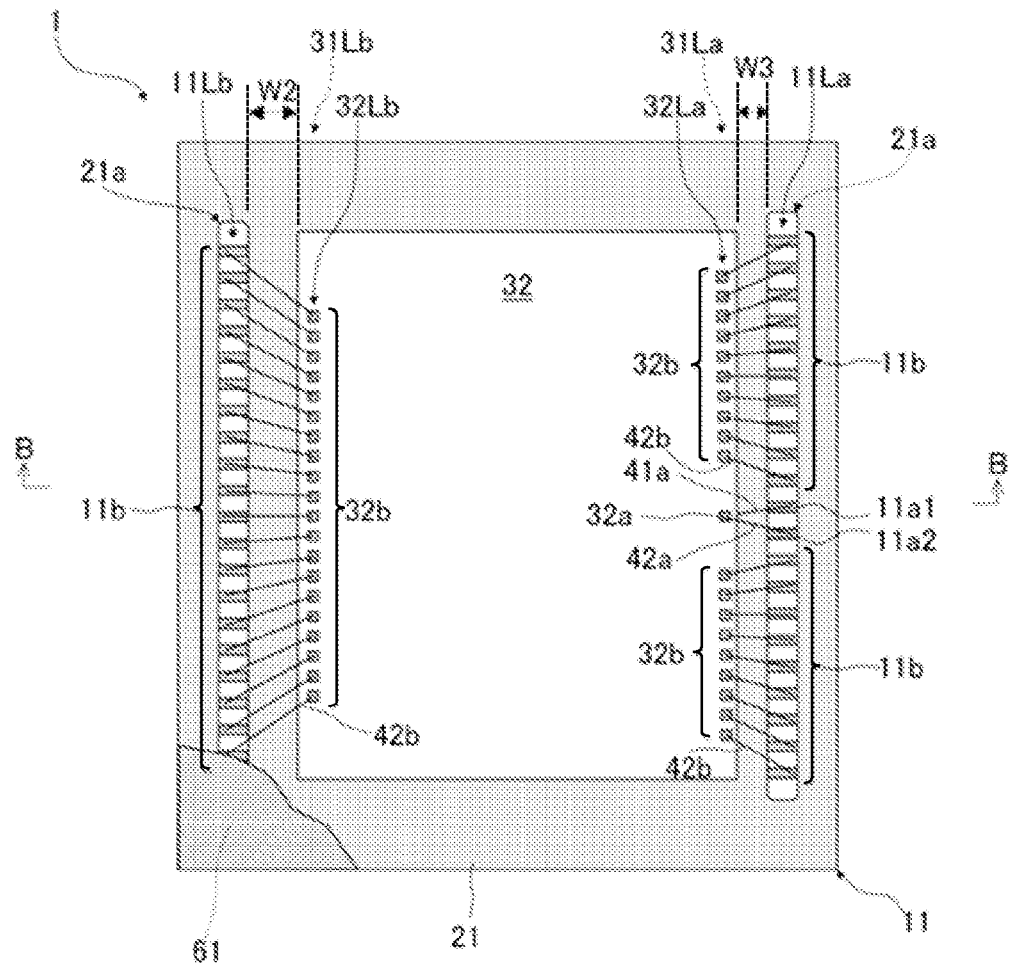
FIGS. 1A and 1B are diagrammatical views of a schematic configuration of a semiconductor chip and a semiconductor device according to a first embodiment, FIG. 1A being a plan view and FIG. 1B being a sectional view of FIG. 1A along a B-B line.
Figure 1B:
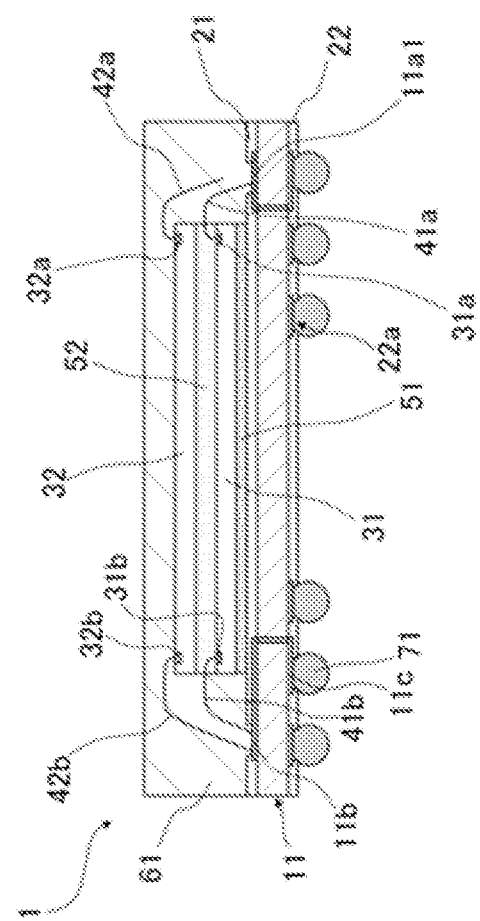

As shown in FIGS. 1A and 1B, a semiconductor device 1 according to a first embodiment includes a wiring substrate 11, and a first (lower) semiconductor chip 31 and a second (upper) semiconductor chip 32 that are stacked together. The first semiconductor chip 31 and the second semiconductor chip 32 are identical in configuration with each other.

The wiring substrate 11 is configured in the following manner.

The wiring substrate 11 includes at least a row of first connection pad group 11La.

The first connection pad group 11La includes first and second independent connection pads 11a1 and 11a2 and multiple common connection pads 11b.

In the first connection pad group 11La, the first and second independent connection pads 11a1 and 11a2 and the multiple common connection pads 11b are arranged at the same interval. The first and second independent connection pads 11a1 and 11a2 are juxtaposed at the center of the first connection pad group 11La. The common connection pads 11b are arranged on both sides of the first and second independent connection pads 11a1 and 11a2.

The first semiconductor chip 31 mounted on one surface of the wiring substrate 11 is configured in the following manner.

The first semiconductor chip 31 includes at least a row of first electrode pad group 31La (which is arranged under a second connection pad group 32La in FIG. 1A.)

The first electrode pad group 31La includes at least one first independent electrode pad 31a and multiple first common electrode pads 31b.

The interval (1-1 pitch) between the first independent electrode pad 31a and an electrode pad (first common electrode pad 31b in this embodiment) adjacent thereto is defined as "first pitch P1".

The interval (1-2 pitch) between adjacent electrode pads making up the multiple first common electrode pads 31b is referred to as "second pitch P2".

The first pitch P1 is determined to be larger than the second pitch P2.

The second semiconductor chip 32 is configured in the following manner.

The second semiconductor chip 32 includes at least a row of second electrode pad group 32La.

The second electrode pad group 32La includes at least one second independent electrode pad 32a and multiple second common electrode pads 32b.

The interval (2-1 pitch) between the second independent electrode pad 32a and an electrode pad (second common electrode pad 32b in this embodiment) adjacent thereto is equivalent to the "first pitch P1" because the first and second semiconductor chips 31 and 32 are identical with each other.

The interval (2-2 pitch) between adjacent pads making up the multiple second common electrode pads 32b is equivalent to the "second pitch P2" because the first and second semiconductor chips 31 and 32 are identical with each other.

On the wiring substrate, the connection pads 11b, 11a1, 11a2, and 11b of the first connection pad group 11La are formed at the same interval, and this interval between adjacent connection pads making up the first connection pad group 11La is referred to as "third pitch P3". The first and second pitches P1 and P2 on the chip side and the third pitch P3 on the substrate side have the following relationship.

"First pitch (e.g., 100 μm)">"third pitch (e.g., 80 μm)">"second pitch (e.g., 60 μm)"

The first independent electrode pad 31a carried by the first semiconductor chip 31 is electrically connected to the first independent connection pad 11a1 on the wiring substrate 11 via a first independent pad wire 41a by one-to-one coupling separated from one-to-one coupling of the second independent electrode pad 32a carried by the second semiconductor chip 32.

The second independent electrode pad 32a carried by the second semiconductor chip 32 is electrically connected to the second independent connection pad 11a2 on the wiring substrate 11 via a second independent pad wire 42a by one-to-one coupling separated from one-to-one coupling of the first independent electrode pad 31a carried by the second semiconductor chip 31.

The front end of the second independent pad wire 42a is not depicted in FIG. 1B showing a sectional view of FIG. 1A along a B-B line, that is, omitted from FIG. 1B. The front end of the second independent pad wire 42a is omitted also from FIGS. 2C to F and FIG. 6B.

The multiple first and second common electrode pads 31b and 32b carried by the first and second semiconductor chips 31 and 32 are electrically connected to the multiple common connection pads 11b via first and second common pad wires 41b and 42b such that each pair of first and second common electrode pads 31b and 32b are connected to each common connection pad 11b by two-to-one coupling.

In addition to the first and second connection pad groups 31La and 32La located closer to one side of the chip, the first and second semiconductor chips 31 and 32 also includes the other rows of electrode pad groups 31Lb and 32Lb located closer to the other side of the chip. In FIG. 1A, the other row of electrode pad group 31Lb carried by the first semiconductor chip 31 is arranged under the other row of electrode pad group 32Lb carried by the second semiconductor chip 32. The other rows of electrode pad groups 31Lb and 32Lb are composed of first and second common connection pads 31b and 32b and are connected to multiple common connection pads 11b making up the other row of common connection pad group 11Lb located closer to the other side of the wiring substrate 11, via first and second common pad wires 41b and 42b. When the distance between the first and second electrode pad groups 31La and 32La and the first connection pad group 11La is "W1" and the distance between the other rows of electrode pad groups 31Lb and 32Lb and the other row of common connection pad group 11Lb is "W2", W2>W1 is satisfied. In the other rows of electrode pad groups 31Lb and 32Lb, the first and second common electrode pads 31b and 32b are arranged at the same interval (second pitch P2). In the other row of common connection pad group 11Lb, the common connection pads 11b are arranged at the same interval (third pitch P3).

On the wiring substrate 11, a sealing layer 61 is so formed as to cover the first and second semiconductor chips 31 and 32.

Constituent elements of the semiconductor device 1 will then be described in detail.

The wiring substrate 11 is constructed by forming given wiring patterns on both sides of a dielectric base material, such as glass epoxy substrate. The wiring substrate 11 is almost rectangular and has a thickness of, for example, 90 μm. The dielectric base material is formed by, for example, impregnating a glass fiber cloth with an epoxy resin and making the cloth into a tabular shape.

A first dielectric film 21 is formed on one surface of the wiring substrate 11, while a second dielectric film 22 is formed on the other surface of the wiring substrate 11. The first and second dielectric films 21 and 22 are each made of, for example, a solder resist layer. Wiring patterns on both surfaces of the wiring substrate 11, except part of the wiring patterns, are covered with the first and second dielectric films 21 and 22.

The first dielectric film 21 on the one surface of the wiring substrate 11 has multiple openings 21a. Multiple connection pads 11a1, 11a2, and 11b are exposed through the multiple openings 21a. The second dielectric film 22 on the other surface of the wiring substrate 11 has multiple openings 22a. Multiple lands 11c formed on the other surface of the wiring substrate 11 are exposed through the multiple openings 22a. The connection pads 11a1, 11a2, and 11b are electrically connected to the lands 11c via conductors inside the wiring substrate 11. Multiple solder balls 11d are attached to the lands 11c and serve as multiple external electrodes.

Another wiring substrate or package may be connected to the solder balls 11d.

The first semiconductor chip 31 is mounted in the approximate central area of the one surface of the wiring substrate 11 via a first adhesive layer 51, such as DAF (Die Attached Film). The first semiconductor chip 31 is shaped into an almost rectangular plate. When the first semiconductor chip 31 is, for example, a memory chip, the multiple electrode pads 31a and 32a are internally connected to a memory circuit formed on the one surface of the first semiconductor chip 31. The second semiconductor chip 32 has the same configuration as that of the first semiconductor chip 31.

The first independent electrode pad 31a is, for example, an electrode pad equivalent to a CS (Chip Select) terminal or CKE (Chip Clock Enable) terminal. The first common electrode pads 31b are, for example, electrode pads equivalent to data input/output terminals. This description applies also to the independent electrode pad and common electrode pads of the second semiconductor chip 32.

The second semiconductor chip 32 is stacked or mounted over the first semiconductor chip 31 via, for example, a second adhesive 52, such as an FOW (Film on Wire). Part of the first independent pad wire 41a and first common pad wires 41b are embedded in the second adhesive 52. The second semiconductor chip 32 is stacked over the first semiconductor chip 31 such that each of the end faces of the second semiconductor chip 32 and each of the end faces of the first semiconductor chip 31 is located on the same plane (z-x plane or z-y plane). The first and second independent pad wires 41a and 42a and first and second common pad wires 41b and 42b are made of, for example, gold, silver, copper, or an alloy of these substances.

The effect of the semiconductor device 1 according to the first embodiment will be described, referring to FIG. 2. Since the first and second semiconductor chips 31 and 32 are identical with each other, both 1-1 pitch (pitch for the independent electrode pad) on the first semiconductor chip 31 and 2-1 pitch (pitch for the independent electrode pad) on the second semiconductor chip 32 are equal to the first pitch P1, and both 1-2 pitch (pitch of the common electrode pads) on the first semiconductor chip 31 and 2-2 pitch (pitch of the common electrode pads) on the second semiconductor chip 32 are equal to the second pitch P2. The pitch of the connection pads on the wiring substrate 11 is the third pitch P3.

(1) On the first semiconductor chip 31, the interval between the first independent electrode pad 31a and the common electrode pad 31b adjacent thereto, i.e., first pitch P1 is determined to be larger than the second pitch P2 representing the interval between adjacent first common electrode pads 31b.

(2) In the same manner, on the second semiconductor chip 32, the interval between the second independent electrode pad 32a and the second common electrode pad 32b adjacent thereto, i.e., first pitch P1 is determined to be larger than the second pitch P2 representing the interval between adjacent first common electrode pads 31b.

(3) The first pitch P1 is determined to be larger than the pitch of the connection pads on the wiring substrate 11, i.e., third pitch P3.

(4) The first and second independent electrode pads 31a and 32a are connected to the first and second connection pads 11a1 and 11a2, respectively, by one-to-one coupling.

(5) On the wiring substrate 11, therefore, the first and second independent connection pads 11a1 and 11a2 are juxtaposed (that is, provided as connection pads independent of each other).

(6) The juxtaposed first and second independent connection pads 11a1 and 11a2 occupy an extra space, thus increasing the length of the first connection pad group 11La.

(7) The first connection pad group 11La thus turns out to be larger in length than the first electrode pad group 31La in terms of machining size.

(8) If intervals between adjacent electrode pads making up the first and second electrode pad groups 31La and 32La are made equal (pitch P1=pitch P2), therefore, shifts in pitch between the electrode pads and the connection pads in their one-to-one connection are gradually accumulated from the center to the edge of the chip and substrate. As a result, a wire stretching angle (angle against a horizontal reference line in FIG. 3) grows larger gradually.

(9) According to the semiconductor device 1 of the first embodiment, the pitch shift caused inevitably in the above manner and the resulting increase in the wire stretching angle are suppressed as much as possible by adopting the configuration of (1) and (2), preferably, the configuration of (1) to (3), that is, by pitch adjustment for the first and second independent electrode pads 31a and 32a.

(10) By determining the interval between the first and second independent electrode pads 31a and 32a and the electrode pads adjacent thereto (common electrode pads 31b and 32b in this embodiment) to be a broader interval, a shift in pitch between the electrode pads and the connection pads in their one-to-one connection is suppressed (that is, a shift in the y direction (vertical direction in FIG. 2)) is reduced) as much as possible and therefore the wire stretching angle is reduced as much as possible.

Figure 2:
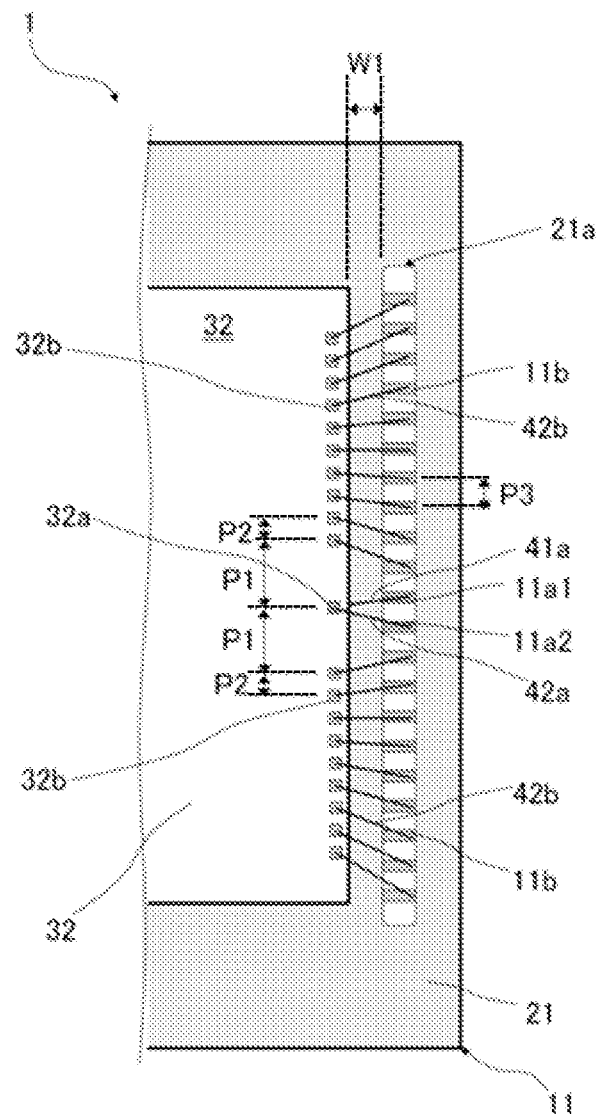
FIG. 2 is a partially enlarged plan view of FIG. 1A.

(11) A reduction in the wire stretching angle results in a reduction in the distance W1 between the first electrode pad group 31La and the first connection pad group 11La (in the x direction, i.e., horizontal direction in FIG. 2).

(12) The reduction in the wire stretching angle and in the distance between the electrode pads and the connection pads lead to a reduction in the length of wires and in the size of the wiring substrate 11, thus leading to a reduction in the size of the semiconductor device 1.

(13) The reduced wire stretching angle prevents short circuit between the wire and the chip edge, thus improving the reliability of the semiconductor device.

(14) The reduction in the length of wires and in the size of the wiring substrate 11 leads to a reduction in the manufacturing cost of the semiconductor device 1.

(15) The broader first pitch P1 provides a space between the first independent electrode pad 31a and the first common electrode pad 31b adjacent thereto and between the second independent electrode pad 32a and the second common electrode pad 32b adjacent thereto, and circuit elements can be disposed in theses spaces.

An example of a manufacturing method for the semiconductor device 1 of FIGS. 1A and 1B will then be described, referring to FIGS. 3A to 3F in order. Processes included in the manufacturing method may be executed simultaneously or in switched order.

Figure 3A:
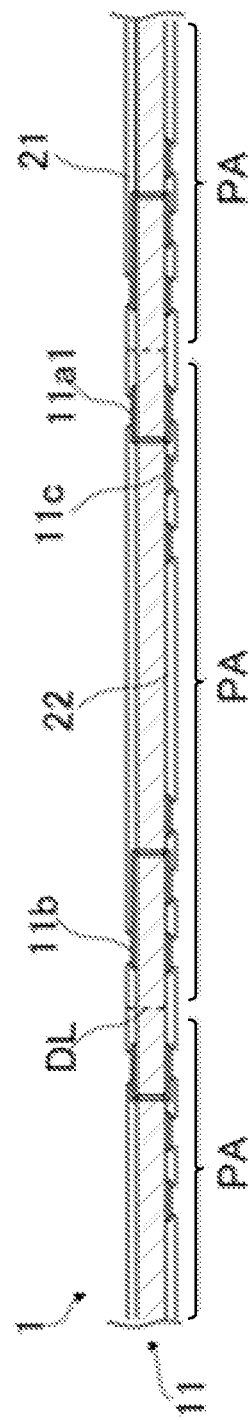
FIGS. 3A to 3F are process diagrams for explaining a manufacturing method for the semiconductor device of the first embodiment.

The wiring substrate 11 shown in FIG. 3A and the first and second semiconductor chips 31 and 32 shown in FIGS. 1A and 1B are prepared.

Multiple product forming areas PA are arranged on the wiring substrate 11, where the product forming areas PA are demarcated by dicing lines DL. Being diced along the dicing lines DL, the wiring substrate 11 is divided into the multiple product forming areas PA, which represent multiple unit wiring substrates 11 making up multiple semiconductor devices 1. On both sides of each unit wiring substrate 11, given wiring patterns are formed, which include the first and second independent connection pads 11a1 and 11a2 (see FIG. 1A), the multiple common connection pads 11b, and the multiple lands 11c. The first dielectric film 21 is formed out of a solder resist on one surface of the unit wiring substrate 11, while the second dielectric film 22 is formed out of a solder resist on the other surface of the unit wiring substrate 11.

Figure 3B:
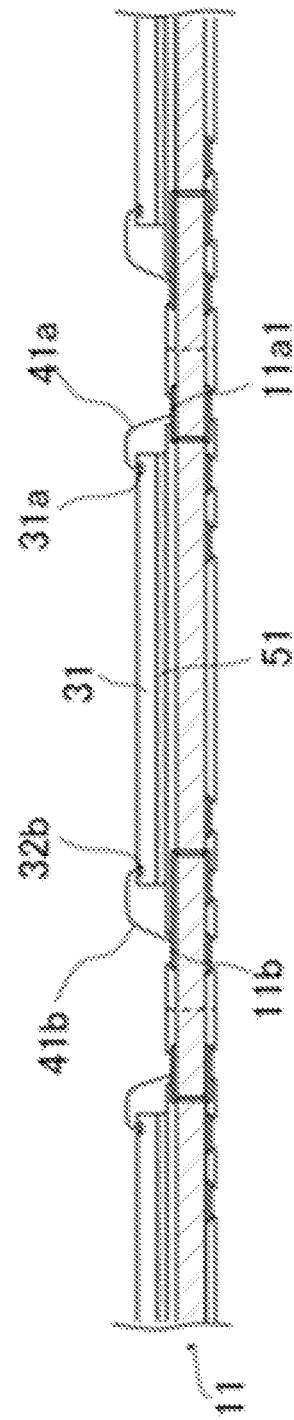

A die bonding process on the first semiconductor chip 31 will be described, referring to FIG. 3B. The wiring substrate 11 is set on a stage (not depicted) of a die bonding apparatus. A collet (not depicted) of the die bonding apparatus sucks and holds the first semiconductor chip 31. To form the first adhesive layer 51 on the back surface of the first semiconductor chip 31, for example, a DAF (Die Attached Film) is pasted on the back surface. On the one surface of the wiring substrate 11, the first semiconductor chip 31 is mounted via the first adhesive layer 51.

The first independent electrode pad 31a and the first common electrode pads 31b are electrically connected to the first independent connection pad 11a1 and the common connection pads 11b via the first independent pad wire 41a and the first common pad wires 41b.

Figure 3C:
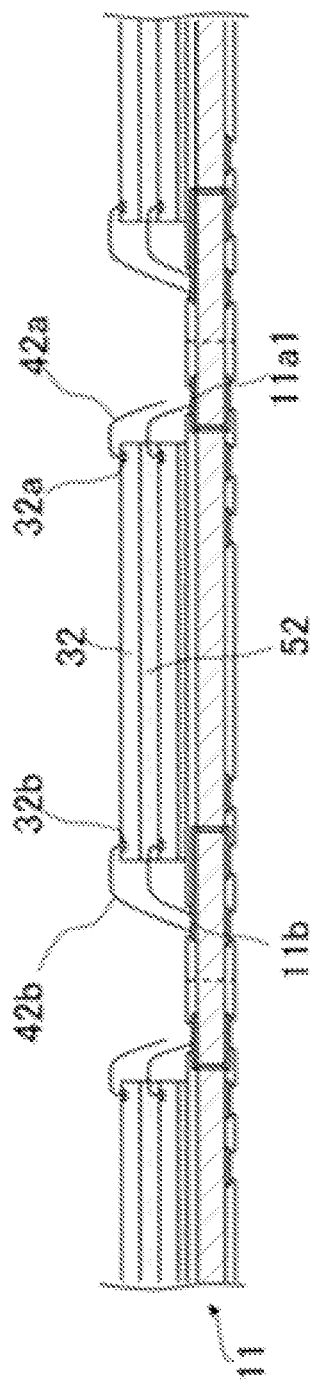

A die bonding process on the second semiconductor chip 32 will be described, referring to FIG. 3C. The above collet sucks and holds the second semiconductor chip 32. An FOW (Film on Wire) film for forming the second adhesive layer 52 is pasted on the back surface of the second semiconductor chip 32. During the die bonding process on the second semiconductor chip 32, the first independent pad wire 41a and the first common pad wires 41b are embedded in the FOW film (second adhesive layer 52) in its low-viscosity state. As these wires are embedded, the second semiconductor chip 32 is stacked or mounted over the first semiconductor chip 31 via the second adhesive layer (FOW film).

The second independent electrode pad 32a and the second common electrode pads 32b are electrically connected to the second independent connection pad 11a2 and the common connection pads 11b via the second independent pad wire 42a and the second common pad wires 42b.

The above stage is provided with a heater (not depicted). The wiring substrate 11, first and second semiconductor chips 31 and 32, first and second adhesive layers 51 and 52, first and second independent pad wires 41a and 42a, and first and second common pad wires 41b and 42b mounted on the stage are heated with the heater. Curing of the first and second adhesive layers 51 and 52 may be performed before the prescribed wire bonding process or, for example, performed together with curing of the sealing layer 61, which will be described later, after the wire bonding process.

Figure 3D:
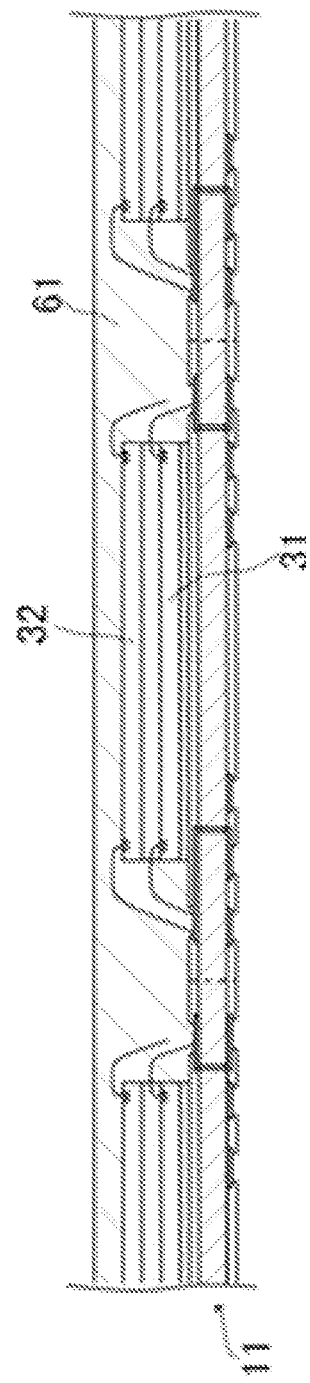

A molding process will be described, referring to FIG. 3D. The wiring substrate 11 is clamped with a molding die composed of upper and lower dies (not depicted). A hot, melted sealing material 61 is injected into the molding die. The sealing material 61 is, for example, a thermosetting resin, such as epoxy resin.

The sealing material 61 is cured to form the sealing layer 61 covering the first and second semiconductor chips 31 and 32 on the one surface of the wiring substrate 11.

Figure 3E:
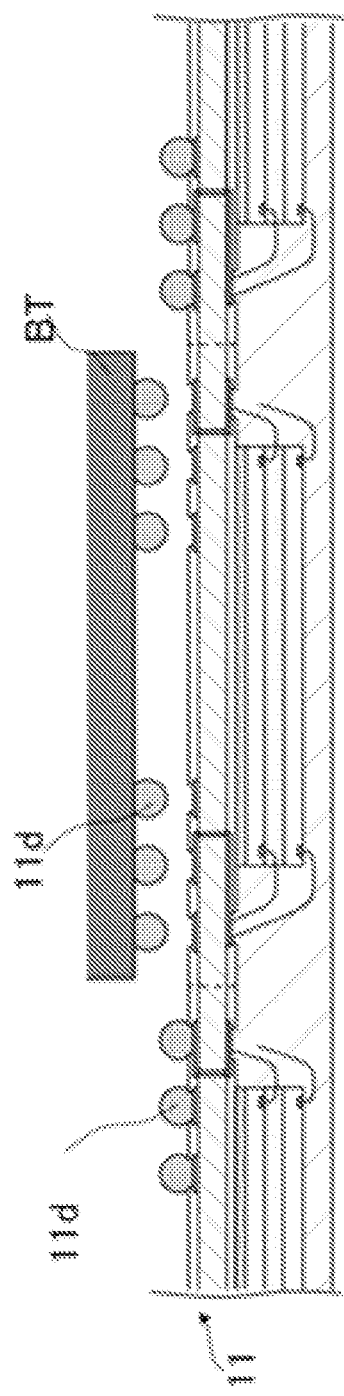

As shown in FIG. 3E, on the other surface of the wiring substrate 11, multiple solder balls 11d are mounted to multiple lands 11c via flux, using a ball mounting apparatus BT. The solder balls 11d are electrically conductive balls, such as metal balls. The wiring substrate 11 is then subjected to reflow-soldering by which the solder balls 11d are melted and connected to the lands 11c.

Figure 3F:
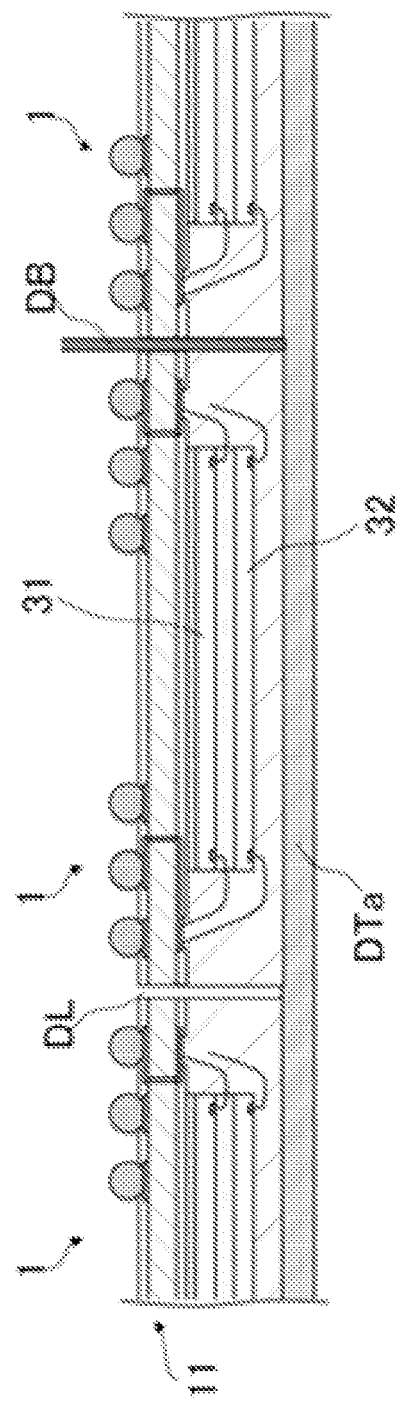

A substrate dicing process will be described, referring to FIG. 3F. A dicing tape DTa is pasted on the sealing layer 61 to support the wiring substrate 11 with the dicing tape DTa. Using a dicing blade DB, the wiring substrate 11 is diced into separate unit wiring substrates corresponding to the product areas PA, respectively. Subsequently, unit wiring substrates are picked from the dicing tape DTa to obtain multiple semiconductor devices 1 one of which is depicted in FIGS. 1A and 1B.

According to this manufacturing method, the wire bonding process requires less man-hour because of the smaller wire stretching angle and shorter wire length.

Second Embodiment

A second embodiment will be described by paying attention to its differences from the first embodiment, and common aspects of both embodiments will be described by referring to the first embodiment on a necessary basis.

As shown in FIG. 2, on the second semiconductor chip 32 on the upper tier included in the semiconductor device 1 of the first embodiment, the electrode pads are equalized in length in the direction of arrangement of the second electrode pad group 32La. This equalization of the electrode pad length applies also to the first semiconductor chip 31 on the lower tier.

Figure 4:
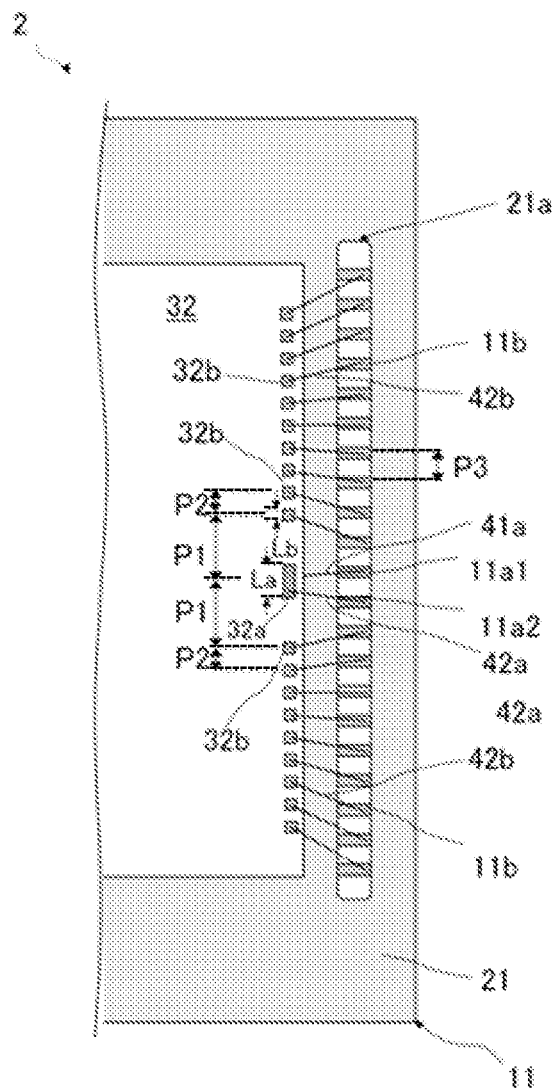
FIG. 4 is a partial plan view diagrammatically showing a schematic configuration of a semiconductor chip and a semiconductor device according to a second embodiment.

As shown in FIG. 4, on the second semiconductor chip 32 on the upper tier included in a semiconductor device 2 of the second embodiment, the second independent electrode pad 32a is formed to be larger in length (and in area) than the second common electrode pads 32b in the direction of arrangement of the second electrode pad group 32La. In other words, the length La of the independent connection pad>the length Lb of the common electrode pads is satisfied. This relation between the length La and the length Lb applies also to the first semiconductor chip 31 on the lower tier.

The semiconductor device 2 of the second embodiment offers the same effect as offered by the semiconductor device 1 of first embodiment. According to the semiconductor device 2, the stretching angle of the first and second independent pad wires 41a and 42a is reduced and the wire length is reduced.

Third Embodiment

A third embodiment will be described by paying attention to its differences from the first embodiment, and common aspects of both embodiments will be described by referring to the first embodiment on a necessary basis.

As shown in FIG. 2, on the second semiconductor chip 32 on the upper tier included in the semiconductor device 1 of the first embodiment, the second electrode pad group 32La includes one second independent electrode pad 32a. This configuration including one independent electrode pad applies also to the first semiconductor chip 31 on the lower tier.

Figure 5:
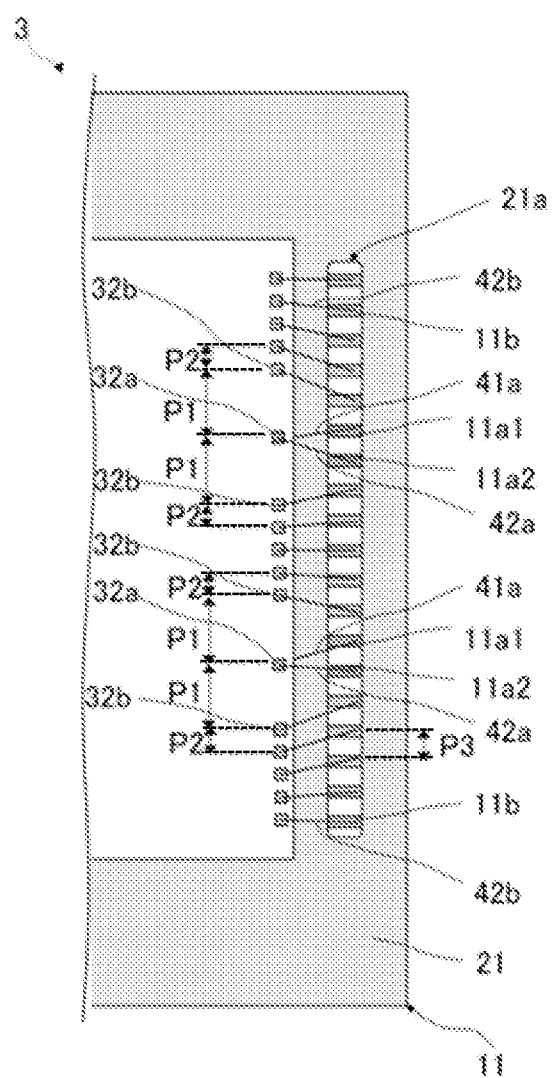
FIG. 5 is a partial plan view diagrammatically showing a schematic configuration of a semiconductor chip and a semiconductor device according to a third embodiment.

As shown in FIG. 5, on the second semiconductor chip 32 on the upper tier included in a semiconductor device 3 of the third embodiment, the second electrode pad group 32La includes two second independent electrode pads 32a and 32a. Between the two second independent electrode pads 32a and 32a, multiple second common electrode pads 32b are arranged. On both sides of a set of the two second independent electrode pads 32a and 32a, the broader first pitches P1 are set, respectively. This setting of the first pitches P1 applies also to the first semiconductor chip 31 on the lower tier.

In this manner, a row of electrode pad group includes multiple independent electrode pads 32a. The semiconductor device 3 of the third embodiment offers the same effect as described in the first embodiment. When multiple independent electrode pads are arranged adjacent to each other, the interval between the independent electrode pads adjacent to each other is determined to be the first pitch P1. It is preferable to set the first pitches P1 on both sides of a set of second independent electrode pads, respectively. However, the first pitch P1 may be set only on one side of the set of second independent electrode pads.

Fourth Embodiment

A fourth embodiment will be described by paying attention to its differences from the first embodiment, and common aspects of both embodiments will be described by referring to the first embodiment on a necessary basis.

As shown in FIG. 2, on the second semiconductor chip 32 on the upper tier included in the semiconductor device 1 of the first embodiment, the second electrode pad group 32La and the other row of electrode pad group 32Lb are arranged in the peripheral area of the chip (near two opposed sides). This electrode pad group arrangement applies also to the first semiconductor chip 31 on the lower tier.

Figure 6A:
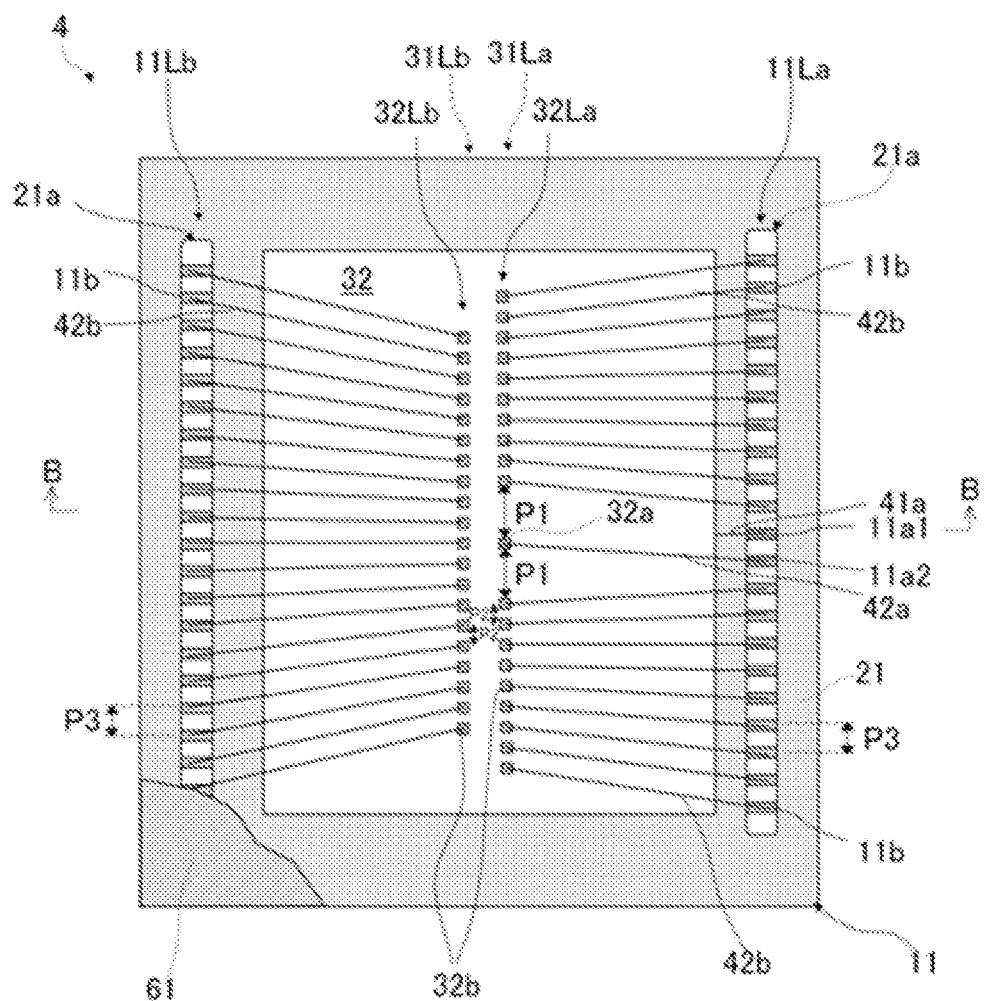
FIGS. 6A and 6B are diagrammatical views of a schematic configuration of a semiconductor chip and a semiconductor device according to a fourth embodiment, FIG. 6A being a plane view and FIG. 6B being a sectional view of FIG. 6A along a B-B line.
Figure 6B:
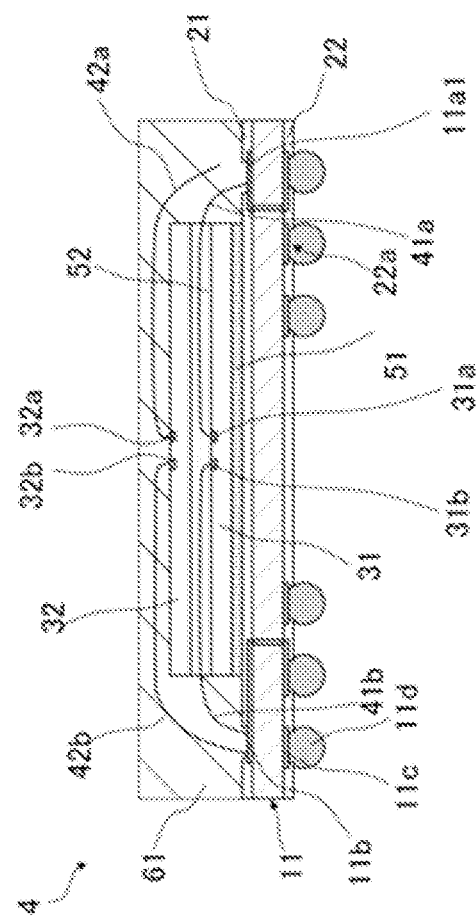

As shown in FIGS. 6A and 6B, on the second semiconductor chip 32 on the upper tier included in a semiconductor device 4 of the fourth embodiment, the second electrode pad group 32La and the other row of electrode pad group 32Lb are arranged in the central area of the chip. This electrode pad group arrangement applies also to the first semiconductor chip 31 on the lower tier.

As described above, the same effect as described in the first embodiment is achieved by various forms of arrangement of electrode pad groups. By arranging the electrode pad groups 32La and 32Lb in the central area of the chip, the wire stretching angle is reduced.

The present invention made by the inventor has been described based on the embodiments. The present invention, however, is not limited to the embodiments but may be modified into various forms of applications on the condition that the modification does not deviate from the substance of the invention. For example, the wiring substrate may be selected properly out of a rigid wiring substrate made of glass epoxy, etc., a flexible wiring substrate made of polyimide, etc., and a wiring substrate having properties between the rigidness and flexibility of those wiring substrates. The semiconductor chip may be selected properly out of a memory chip, a logic chip, and other types of chips. Multiple semiconductor chips mounted on the wiring substrate may be identical or different in configuration with and from each other. For example, a DRAM, flash memory chip, etc., may be mounted on the wiring substrate.

CONCLUSION

In one embodiment, there is provided a semiconductor device comprising: a substrate including first, second, third and fourth connection pads arranged in this order; and first and second semiconductor chips stacked with one another, each of the first and second semiconductor chips including first, second and third electrodes arranged in this order without intervening any electrodes that are coupled to the substrate, and a distance between the first electrode and the second electrode being larger than a distance between the second electrode and the third electrode, wherein the first connection pad is coupled to the first electrode of the first semiconductor chip without coupling to the second semiconductor chip, the second connection pad is coupled to the first electrode of the second semiconductor chip without coupling to the first semiconductor chip, the third connection pad is coupled to both of the second electrodes of the first and second semiconductor chips, and the fourth connection pad is coupled to both of the third electrodes of the first and second semiconductor chips.

In another embodiment, there is provided a semiconductor device comprising: a substrate including first, second, third and fourth connection pads arranged in this order with a first pitch; a first semiconductor chip mounted over the substrate, the first semiconductor chip including first, second and third electrodes arranged in this order without intervening any electrodes that are coupled to the substrate, a second pitch between the first electrode and the second electrode being larger than the first pitch, a third pitch between the second electrode and the third electrode being smaller than the first pitch; and a second semiconductor chip stacked over the first semiconductor chip, the second semiconductor chip including fourth, fifth and sixth electrodes arranged in this order, the fourth, fifth and sixth electrodes being vertically aligned with the first, second and third electrodes, wherein the first connection pad is coupled to the first electrode without coupling the second semiconductor chip, the second connection pad is coupled to the fourth electrode without coupling the first semiconductor chip, the third connection pad is coupled to both of the second and fifth electrodes, and the fourth connection pad is coupled to both of the third and sixth electrodes.

In yet another embodiment, there is provided a semiconductor device comprising: a substrate including a plurality of connection pads arranged in a line; a first semiconductor chip including a plurality of first electrodes arranged in a line, the first semiconductor chip being mounted over the substrate, the first electrodes including a first independent electrode and a plurality of first common electrodes, the first independent electrode being arranged such that a distance between the first independent electrode and an adjacent one of the first common electrodes is larger than a distance between adjacent two of the first common electrodes without intervening any electrodes that are coupled to the connection pads; and a second semiconductor chip including a plurality of second electrodes arranged in a line, the second semiconductor chip being stacked over the first semiconductor chip, each of the second electrodes being vertically aligned with an associated one of the first electrodes, wherein the connection pads includes a first independent connection pad and a plurality of common connection pads, the first independent connection pad is coupled to the first independent electrode without coupling the second semiconductor chip, each of the common connection pads is coupled to both of an associated one of the first common electrodes and an associated one of the second electrodes.

In another embodiment, there is provided a semiconductor device comprising: a first semiconductor chip including first, second and third electrode pads arranged in line, the second electrode pad being between the first and third electrode pads such that a distance between the first and second electrode pads being larger than a distance between the second and third electrode pads, the first, second and third electrodes pads being configured to be supplied with a first signal, a second signal and a third signal, respectively, from an outside of the first semiconductor chip; and a second semiconductor chip including fourth, fifth and sixth electrode pads arranged in line, the fifth electrode pad being between the fourth and sixth electrode pads such that a distance between the fourth and fifth electrode pads being larger than a distance between the fifth and sixth electrode pads, the fourth, fifth and sixth electrodes pads being configured to be supplied respectively with a fourth signal, the second signal and the third signal, respectively, from an outside of the second semiconductor chip; and the first and second semiconductor chips being stacked with each other such that the first, second and third electrode pads are vertically aligned with the fourth, fifth and sixth electrode pads, respectively.

(Appendant)

[Appendant 1, Third Aspect]

A semiconductor device comprising a semiconductor chip, wherein a row of electrode pad group on the semiconductor chip includes a first electrode pad, a third electrode pad, a fourth electrode pad, and a second electrode pad arranged in this order, the first electrode pad serving as an independent electrode pad and the second to fourth electrode pads serving as common electrode pads, and wherein an interval between the first electrode pad and the third electrode pad is larger than an interval between the third electrode pad and the fourth electrode pad and an interval between the fourth electrode pad and the second electrode pad.

[Appendant 2]

The semiconductor device of appendant 1, wherein an interval between adjacent connection pads making up a row of connection pad group on a wiring substrate is smaller than the interval between the first electrode pad and the third electrode pad and is larger than the interval between the third electrode pad and the fourth electrode pad and the interval between the fourth electrode pad and the second electrode pad.

[Appendant 3]

The semiconductor device of appendant 2, comprising wires connecting a row of electrode pad group on the semiconductor chip to a row of connection pad group on the wiring substrate.

Constituent elements preferable in the first to third aspects will hereinafter be described. It is obvious that a semiconductor device carrying a plurality of semiconductor chips is provided with a plurality of the following constituent elements in accordance with the number of the semiconductor chips.

[Appendant 4]

A first independent electrode pad is electrically connected to a first independent connection pad on a wiring substrate by one-to-one coupling separated from one-to-one coupling of a second independent electrode pad carried by a different semiconductor chip.

A plurality of first common electrode pads and a plurality of second common electrode pads carried by the different semiconductor chip are electrically connected to a plurality of common connection pads on the wiring substrate such that each pair of first and second common electrode pads are connected to each common connection pad by two-to-one coupling.

[Appendant 5]

The plurality of first common electrode pads are arranged at the same interval.

[Appendant 6]

In a first electrode pad group, pluralities of first common electrode pads are arranged on both sides of a first independent electrode pad, respectively.

[Appendant 7]

In a direction of arrangement of a first electrode pad group, a first independent electrode pad is larger in length or in area than a first common electrode pad.

[Appendant 8]

A first electrode pad group includes a plurality of first independent electrode pads.

[Appendant 9]

A semiconductor chip includes the other row of electrode pad group, in addition to the first electrode pad group.

[Appendant 10]

The first electrode pad group and the other row of electrode pad group are arranged in the peripheral area or central area of a semiconductor chip.

Within the scope of the present invention fully disclosed herein (including the claims and drawings), the embodiments and examples may be modified or altered based on the basic technical concept of the invention. Within the scope of the claims of the present invention, various disclosed elements (including elements of individual claims, embodiments, examples, and drawings) may be combined and selected in various manners. It is therefore obvious that the present invention includes various modifications and alterations that those who are skilled in the art will be able to make according to the entire disclosed elements and technical concept including the claims and drawings. It should be understood that numerical values and their ranges described in this specification include any given intermediate values, smaller values, and smaller ranges even if such values and ranges are not specified clearly.

What is claimed is:

1. A semiconductor device comprising:
a substrate including first, second, third and fourth connection pads arranged in this order; and
first and second semiconductor chips stacked with one another, each of the first and second semiconductor chips including first, second and third electrodes arranged in this order without intervening any electrodes that are coupled to the substrate, and a distance between the first electrode and the second electrode being larger than a distance between the second electrode and the third electrode,
wherein the first connection pad is coupled to the first electrode of the first semiconductor chip without coupling to the second semiconductor chip, the second connection pad is coupled to the first electrode of the second semiconductor chip without coupling to the first semiconductor chip, the third connection pad is coupled to both of the second electrodes of the first and second semiconductor chips, and the fourth connection pad is coupled to both of the third electrodes of the first and second semiconductor chips;

wherein each of the first and second semiconductor chips includes fourth and fifth electrodes arranged in order of the fifth, fourth, first, second and third electrodes, and a distance between the first electrode and the fourth electrode is larger than a distance between the fourth electrode and the fifth electrode;

wherein the distance between the first electrode and the fourth electrode is same as the distance between the first electrode and the second electrode, and the distance between the fourth electrode and the fifth electrode is same as the distance between the second electrode and the third electrode.

2. The semiconductor device as claimed in claim 1, further comprising:

a first wire coupling the first connection pad of the substrate to the first electrode of the first semiconductor chip;

a second wire coupling the second connection pad of the substrate to the first electrode of the second semiconductor chip;

a third wire coupling the third connection pad of the substrate to the second electrode of the first semiconductor chip; and a fourth wire coupling the third connection pad of the substrate to the second electrode of the second semiconductor chip, and the third connection pad being coupled to both of the second electrodes of the first and second semiconductor chips by the third and fourth wires.

3. The semiconductor device as claimed in claim 1, wherein the substrate includes fifth and sixth connection pads, the fifth connection pad is coupled to both of the fourth electrodes of the first and second semiconductor chips, and the sixth connection pad is coupled to both of the fifth electrodes of the first and second semiconductor chips.

4. The semiconductor device as claimed in claim 1, wherein each of the first electrodes of the first and second semiconductor chips is larger in width than each of the second and third electrodes of the first and second semiconductor chips.

5. The semiconductor device as claimed in claim 1, wherein the second semiconductor chip is stacked over the first semiconductor chip, and the first, second and third electrodes of the second semiconductor chip are vertically aligned with the first, second and third electrodes of the first semiconductor chip.

6. The semiconductor device as claimed in claim 1, wherein the first, second, third and fourth connection pads are arranged along a long side of the substrate, the first, second and third electrodes of the first semiconductor chip are arranged along a long side of the first semiconductor chip, the long side of the first semiconductor chip faces the long side of the substrate, and the first, second and third electrodes of the second semiconductor chip are arranged along a long side of the second semiconductor chip, the long side of the second semiconductor chip faces the long side of the substrate.

7. The semiconductor device as claimed in claim 1, wherein the first and second semiconductor chips are a memory chip having an identical configuration, and the first electrode is selected one of a CS (chip select) electrode and a CKE (clock enable) electrode.

8. A semiconductor device comprising:

a substrate including first, second, third and fourth connection pads arranged in this order with a first pitch;

a first semiconductor chip mounted over the substrate, the first semiconductor chip including first, second and third electrodes arranged in this order without intervening any electrodes that are coupled to the substrate, a second pitch between the first electrode and the second electrode being larger than the first pitch, a third pitch between the second electrode and the third electrode being smaller than the first pitch; and a second semiconductor chip stacked over the first semiconductor chip, the second semiconductor chip including fourth, fifth and sixth electrodes arranged in this order, the fourth, fifth and sixth electrodes being vertically aligned with the first, second and third electrodes, wherein the first connection pad is coupled to the first electrode without coupling the second semiconductor chip, the second connection pad is coupled to the fourth electrode without coupling the first semiconductor chip, the third connection pad is coupled to both of the second and fifth electrodes, and the fourth connection pad is coupled to both of the third and sixth electrodes;

wherein the first semiconductor chip includes seventh and eighth electrodes arranged in order of the seventh, eighth, first, second and third electrodes, and wherein a distance between the first electrode and the seventh electrode is larger than a distance between the seventh electrode and the eighth electrode;

wherein the distance between the first electrode and the seventh electrode is same as the distance between the first electrode and the second electrode, and the distance between the seventh electrode and the eighth electrode is same as the distance between the second electrode and the third electrode.

9. The semiconductor device as claimed in claim 8, further comprising:

a first wire coupling the first connection pad to the first electrode;

a second wire coupling the second connection pad to the fourth electrode;

a third wire coupling the third connection pad to the second electrode; and a fourth wire coupling the third connection pad to the fifth electrode, the third connection pad being coupled to both of the second and fifth electrodes by the third and fourth wires.

10. The semiconductor device as claimed in claim 8, wherein each of the first and fourth electrodes is larger in width than each of the second, third, fifth and sixth electrodes.

11. A semiconductor device comprising:

a substrate including a plurality of connection pads arranged in a line;

a first semiconductor chip including a plurality of first electrodes arranged in a line, the first semiconductor chip being mounted over the substrate, the first electrodes including a first independent electrode and a plurality of first common electrodes, the first independent electrode being arranged such that a distance between the first independent electrode and an adjacent one of the first common electrodes is larger than a distance between adjacent two of the first common electrodes without intervening any electrodes that are coupled to the connection pads; and a second semiconductor chip including a plurality of second electrodes arranged in a line, the second semiconductor chip being stacked over the first semiconductor chip, each of the second electrodes being vertically aligned with an associated one of the first electrodes, wherein the connection pads includes a first independent connection pad and a plurality of common connection pads, the first independent connection pad is coupled to the first independent electrode without coupling the second semiconductor chip, each of the common connection pads is coupled to both of an associated one of the first common electrodes and an associated one of the second electrodes.

12. The semiconductor device as claimed in claim 11, wherein the second electrodes include a second independent electrode and a plurality of second common electrodes, and the connection pads further include a second independent connection pad, the second independent connection pad is coupled to the second independent electrode without coupling the first semiconductor chip, each of the common connection pads is coupled to both of the associated one of the first common electrodes and an associated one of the second common electrodes.

13. The semiconductor device as claimed in claim 12, further comprising:
   a first wire coupling the first independent connection pad to the first independent electrode;
   a second wire coupling the second independent connection pad to the second independent electrode;
   a plurality of third wires coupling the common connection pads to the first common electrodes; and
   a plurality of fourth wires coupling the common connection pads to the second common electrodes, the common connection pads being coupled to both of the first and second common electrodes by the third and fourth wires.

14. The semiconductor device as claimed in claim 11, wherein the first independent electrode is larger in width than each of the first common electrodes.

15. The semiconductor device as claimed in claim 11, wherein the first electrodes further include a third independent electrode, the third independent electrode is arranged such that a distance between the third independent electrode and an adjacent one of the first common electrodes is larger than the distance between the adjacent two of the first common electrodes.

16. The semiconductor device as claimed in claim 15, wherein the connection pads further include the third independent connection pad, the third independent connection pad is coupled to the third independent electrode without coupling the second semiconductor chip.

17. The semiconductor device as claimed in claim 11, wherein the distance between the first independent electrode and the adjacent one of the first common electrodes is larger than a distance between adjacent two of the connection pads, and
   the distance between the adjacent two of the first common electrodes is smaller than the adjacent two of the connection pads.

18. The semiconductor device as claimed in claim 11, wherein the first independent electrode is arranged such that a distance between the first independent electrode and another adjacent one of the first common electrodes is larger than a distance between the adjacent two of the first common electrodes without intervening any of electrodes that are coupled to the connection pads.

19. A semiconductor device comprising:
   a first semiconductor chip including first, second and third electrode pads arranged in line, the second electrode pad being between the first and third electrode pads such that a distance between the first and second electrode pads being larger than a distance between the second and third electrode pads, the first, second and third electrodes pads being configured to be supplied with a first signal, a second signal and a third signal, respectively, from an outside of the first semiconductor chip; and
   a second semiconductor chip including fourth, fifth and sixth electrode pads arranged in line, the fifth electrode pad being between the fourth and sixth electrode pads such that a distance between the fourth and fifth electrode pads being larger than a distance between the fifth and sixth electrode pads, the fourth, fifth and sixth electrodes pads being configured to be supplied respectively with a fourth signal, the second signal and the third signal, respectively, from an outside of the second semiconductor chip; and
   the first and second semiconductor chips being stacked with each other such that the first, second and third electrode pads are vertically aligned with the fourth, fifth and sixth electrode pads, respectively.

20. The device as claimed in claim 19, wherein the first semiconductor chip further includes seventh and eighth electrode pads and the second semiconductor chip further includes ninth and tenth electrode pads;
   the seventh and eighth electrode pads being arranged in line with the first electrode pad on an opposite side of the second and third electrode pads, the seventh electrode pad being between the first and eighth electrode pads such that a distance between the first and seventh electrode pads being larger than a distance between the seventh and eighth electrode pads, the seventh and eighth electrodes pads being configured to be supplied with a fifth signal and a sixth second signal, respectively, from the outside of the first semiconductor chip;
   the ninth and tenth electrode pads being arranged in line with the fourth electrode pad on an opposite side of the fifth and sixth electrode pads, the ninth electrode pad being between the fourth and tenth electrode pads such that a distance between the fourth and ninth electrode pads being larger than a distance between the ninth and tenth electrode pads, the ninth and tenth electrodes pads being configured to be supplied with the fifth signal and the sixth second signal, respectively, from the outside of the second semiconductor chip; and
   the ninth and tenth electrode pads of the first semiconductor chip being vertically aligned with the ninth and tenth electrode pads of the second semiconductor chip.

21. The device as claimed in claim 19, further comprising a substrate including first, second, third and fourth connection pads, the first and second semiconductor chips being stacked with each over the substrate, the first connection pad being coupled to the first electrode pad, the second connection pad being coupled to the fourth electrode pad, the third connection pad being coupled to the second and fifth electrode pads, and the fourth connection pad being coupled to the third and sixth electrode pads.

* * * * *